US009710589B2

(12) United States Patent
Dave et al.

(10) Patent No.: US 9,710,589 B2
(45) Date of Patent: Jul. 18, 2017

(54) USING A CUT MASK TO FORM SPACES REPRESENTING SPACING VIOLATIONS IN A SEMICONDUCTOR STRUCTURE

(71) Applicant: Advanced Micro Devices, Inc., Sunnyvale, CA (US)

(72) Inventors: Kalpeshkumar Girishchandra Dave, Bangalore (IN); Naveen Chandra Srivastava, Kanpur (IN); Pankaj Kumar, Hardoi (IN); Janardhan Achanta, Kakinada (IN); Shreekanth Karandoor Sampigethaya, Kannamangala (IN)

(73) Assignee: Advanced Micro Devices, Inc., Sunnyvale, CA (US)

( * ) Notice: Subject to any disclaimer, the term of this patent is extended or adjusted under 35 U.S.C. 154(b) by 95 days.

(21) Appl. No.: 14/748,795

(22) Filed: Jun. 24, 2015

(65) Prior Publication Data

US 2016/0378899 A1    Dec. 29, 2016

(51) Int. Cl.
  *G06F 17/50* (2006.01)
  *H01L 21/28* (2006.01)
  *H01L 21/8234* (2006.01)
  *G03F 7/00* (2006.01)

(52) U.S. Cl.
  CPC .... *G06F 17/5072* (2013.01); *H01L 21/28123* (2013.01); *G03F 7/0002* (2013.01); *G06F 17/5081* (2013.01); *H01L 21/823425* (2013.01)

(58) Field of Classification Search
  CPC ............. G06F 17/5072; G06F 17/5081; G03F 7/0002; H01L 21/28123; H01L 21/823425
  See application file for complete search history.

(56) References Cited

U.S. PATENT DOCUMENTS

| | | | |
|---|---|---|---|
| 5,600,171 A | 2/1997 | Makihara et al. | |
| 5,917,224 A | 6/1999 | Zangara | |
| 6,380,636 B1 | 4/2002 | Tatsukawa et al. | |
| 7,785,946 B2 * | 8/2010 | Haffner | H01L 21/28123 257/368 |
| 7,919,792 B2 * | 4/2011 | Law | H01L 27/0207 257/202 |
| 8,134,870 B2 | 3/2012 | Alami et al. | |
| 8,212,295 B2 | 7/2012 | Liaw | |
| 8,293,656 B2 | 10/2012 | Kim et al. | |
| 8,656,322 B1 * | 2/2014 | Dechene | G03F 7/0002 716/55 |
| 8,658,486 B2 * | 2/2014 | Aquilino | H01L 21/823807 257/E21.414 |
| 8,701,077 B1 | 4/2014 | Lemsitzer et al. | |

(Continued)

*Primary Examiner* — Naum B Levin
(74) *Attorney, Agent, or Firm* — Rory D. Rankin; Meyertons, Hood, Kivlin, Kowert & Goetzel, P.C.

(57) ABSTRACT

Systems, apparatuses, and methods for reducing the area of a semiconductor structure. A spacing violation may be detected for a gap width used to separate first and second regions of a layer of semiconductor material. In response to detecting the violation, the first and second regions are merged into a combined region, and then a cut mask layer is formed above the combined region. Next, an etch process is performed through the cut mask layer to remove an exposed third region within the combined region, wherein the exposed third region is interposed between first and second region portions of the combined region.

17 Claims, 8 Drawing Sheets

(56) References Cited

U.S. PATENT DOCUMENTS

| | | | |
|---|---|---|---|
| 8,750,011 B2 | 6/2014 | Liaw | |
| 8,799,834 B1* | 8/2014 | Chen | G06F 17/5081 430/30 |
| 9,147,730 B2* | 9/2015 | Xie | H01L 29/0692 |
| 9,405,879 B2* | 8/2016 | Wang | G06F 17/5081 |
| 2008/0251878 A1* | 10/2008 | Mandelman | H01L 27/11 257/506 |
| 2013/0174106 A1 | 7/2013 | Hsu et al. | |
| 2013/0313647 A1* | 11/2013 | Aquilino | H01L 21/823807 257/368 |
| 2014/0145342 A1 | 5/2014 | Schultz et al. | |
| 2014/0339647 A1* | 11/2014 | Rashed | G06F 17/5072 257/401 |
| 2015/0278428 A1* | 10/2015 | Wang | G06F 17/5081 716/112 |
| 2015/0339428 A1* | 11/2015 | Yuan | G06F 17/5081 716/52 |
| 2016/0049190 A1* | 2/2016 | Han | G11C 11/4076 365/51 |

\* cited by examiner

USING A CUT MASK TO FORM SPACES REPRESENTING SPACING VIOLATIONS IN A SEMICONDUCTOR STRUCTURE

BACKGROUND

Technical Field

Embodiments described herein relate to the field of integrated circuit design and more particularly, to semiconductor area optimization.

Description of the Related Art

The semiconductor industry aims to manufacture integrated circuits with higher and higher densities of semiconductor devices on a smaller chip area to achieve greater functionality and to reduce manufacturing costs. This desire for large scale integration has led to a continued shrinking of circuit dimensions and device features. The ability to reduce the size of structures is driven by lithographic performance.

With conventional photolithography systems, radiation is provided through or reflected off a mask or reticle to form an image on a semiconductor wafer. Generally, the image is focused on the wafer to expose and pattern a layer of material, such as photoresist material. In turn, the photoresist material is utilized to define doping regions, deposition regions, etching regions, or other structures and features in one or more layers of the semiconductor wafer. The photoresist material can also define conductive lines or conductive pads associated with metal layers of a semiconductor device. Further, the photoresist material can define isolation regions, transistor gates, or other transistor structures and elements.

A multiple exposure/pattern process utilizes two or more photolithographic sub-processes and two or more photomasks and can be used to form patterns of extremely small and tightly packed features. A pitch or distance between lines on a photomask must be greater than a certain amount for a given wavelength and aperture of a lens used in the photolithographic process. Downward scaling of pitch or line separation is ultimately limited by the practical performance capabilities of the photolithographic tools. Consequently, certain design rules are commonly used to check the viability and manufacturability of desired semiconductor device features. For example, design rule check (DRC) methodologies can be applied to identify potential spacing violations in a proposed layout of conductive traces, such as local interconnects. Thus, if the proposed layout includes spacing that is too short for the particular photolithographic tool, then it may not be possible to fabricate devices using that proposed layout without shorting some conductive traces together.

SUMMARY

Systems, apparatuses, and methods for reducing the spacing in metal and/or contact layers in a semiconductor structure are contemplated.

In one embodiment, a semiconductor structure may include two separate diffusion contacts of a first layer of semiconductor material (e.g., silicon). In various embodiments, an attempt to reduce the distance between two separate diffusion contacts of a transistor may be made. However, if the separation width between the two diffusion contacts is less than a minimum allowable distance for the particular photolithographic tool being used, a spacing violation may be generated by a design rule check (DRC) tool during layout verification.

In one embodiment, in order to overcome a spacing violation, the two separate diffusion contacts may be merged into a combined region of the first layer of semiconductor material. Subsequently, a cut mask layer may be formed adjacent to the combined region of the first layer of semiconductor material. Next, a process may be used to remove an exposed third region within the combined region of the layer of semiconductor material, where the exposed third region is interposed between first and second region portions of the combined region. In one embodiment, the width of the exposed third region may be less than the minimum allowable separation distance for the particular photolithographic tool being used to form features on the semiconductor structure.

These and other features and advantages will become apparent to those of ordinary skill in the art in view of the following detailed descriptions of the approaches presented herein.

BRIEF DESCRIPTION OF THE DRAWINGS

The above and further advantages of the methods and mechanisms may be better understood by referring to the following description in conjunction with the accompanying drawings, in which.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Figure 1:
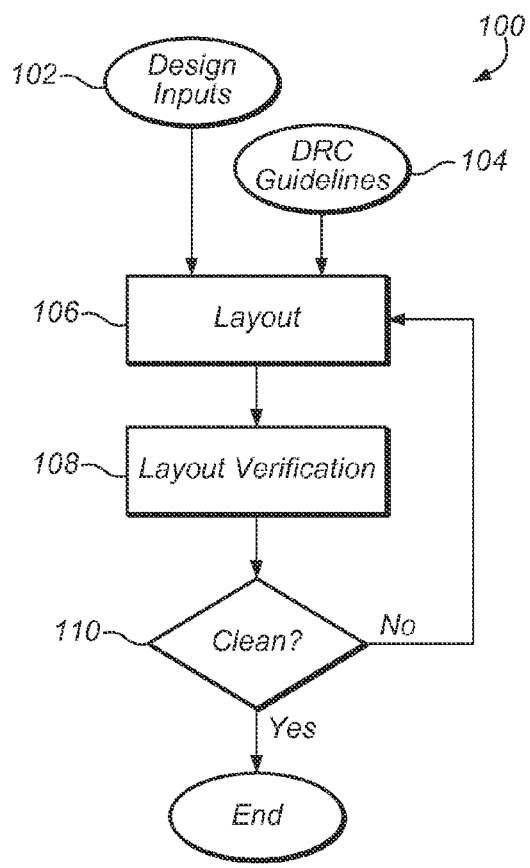
FIG. 1 is a block diagram of one embodiment of a prior art circuit design flow.

Referring now to FIG. 1, a block diagram of one embodiment of a prior art circuit design flow 100 is shown. Design inputs 102 may be used to generate the circuit layout in step 106. Then, a layout verification step 108 may be performed using design rule checker (DRC) guidelines 104. If the layout is clean as determined in step 110, then the circuit design flow 100 may end. If the layout is not clean as determined in step 110, then the circuit design flow 100 may return to generate a new layout 106 of the circuit.

Figure 2:
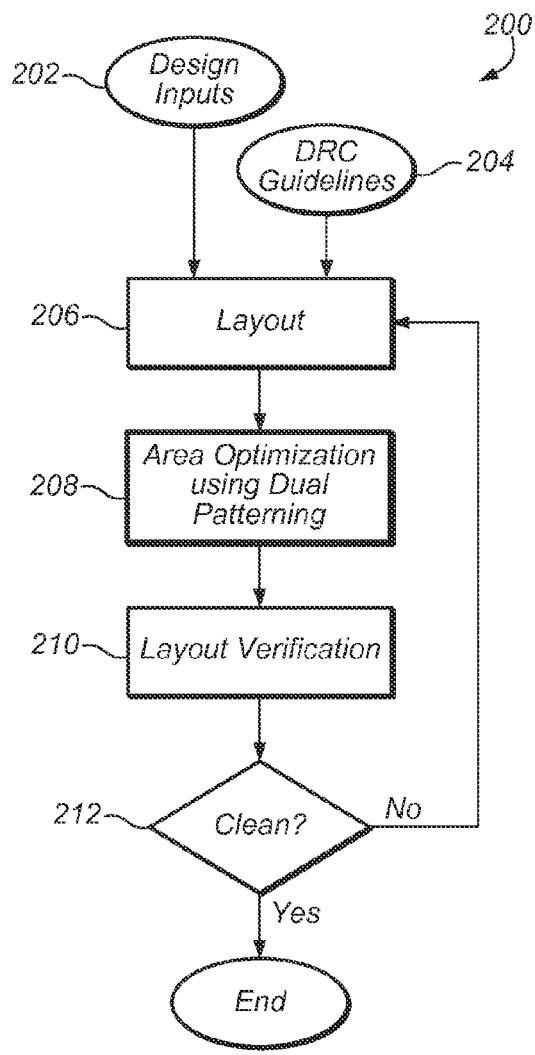
FIG. 2 is a block diagram of one embodiment of a new circuit design flow.

Turning now to FIG. 2, a block diagram of one embodiment of a new circuit design flow 200 is shown. Design inputs 202 may be used to generate the circuit layout in step 206. Next, the area of selected circuit elements within the layout may be optimized to reduce the area using dual patterning in step 208. Then, the circuit layout may be verified in step 210 using the DRC guidelines 204. Then, if the circuit layout meets the DRC requirements (conditional block 212, "yes" leg), then design flow 200 may end. Otherwise, if the circuit layout does not meet the DRC requirements (i.e., is not clean) (conditional block 212, "no" leg), then design flow 200 may return to step 206 and generate a new layout of the circuit design.

Design flow 200 may be utilized to fabricate a semiconductor device, and the semiconductor device may be utilized in a variety of electronic applications and computing systems, such as computers, smartphones, tablets, digital cameras, watches, and other computing devices. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Figure 3:
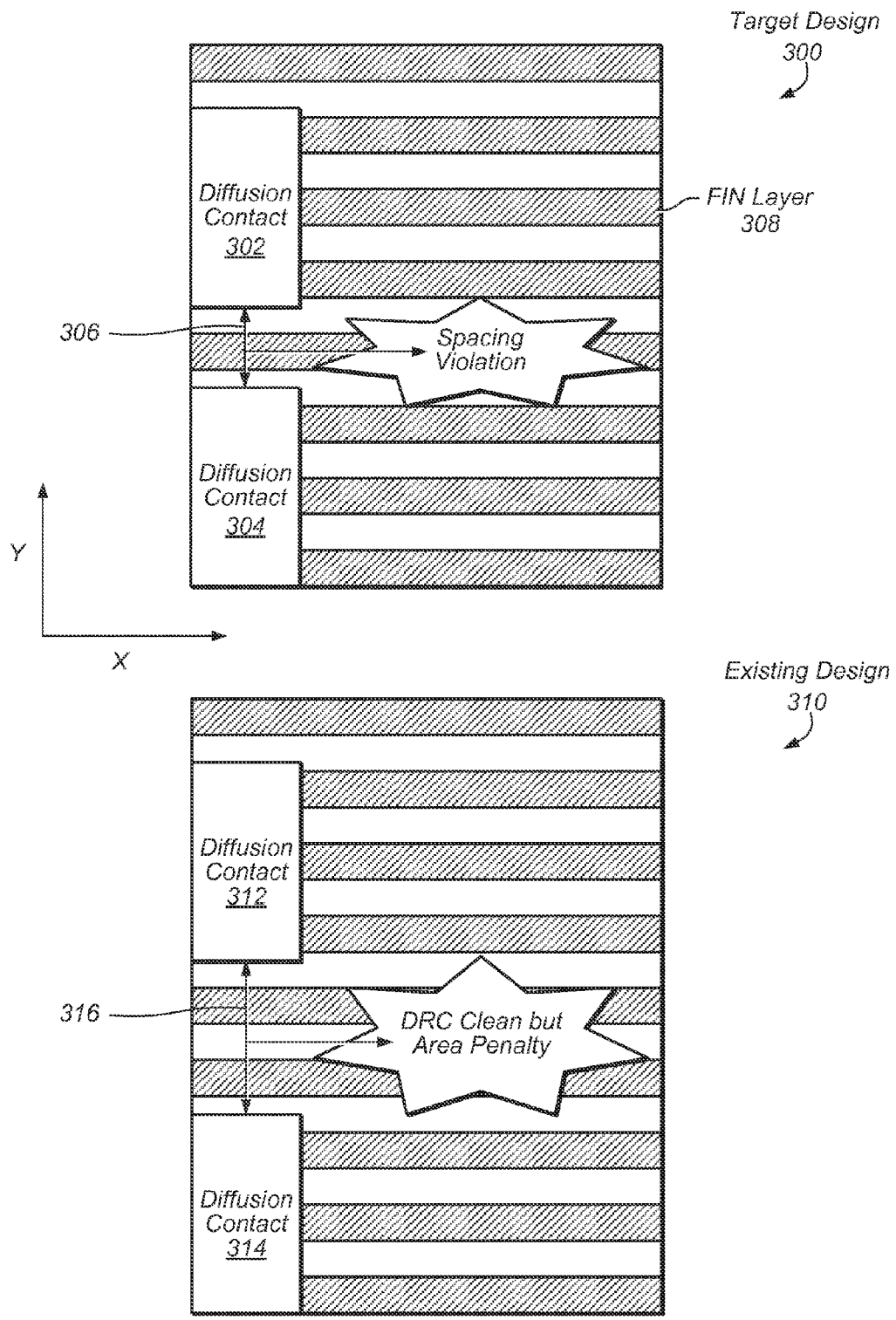
FIG. 3 illustrates diagrams of a target design and existing design in accordance with one embodiment.

Referring now to FIG. 3, diagrams of one embodiment of a target design 300 and existing design 310 are shown. At the top of FIG. 3, target design 300 is shown representing a top view of a semiconductor structure with at least one goal of target design 300 being to reduce the size of the transistor in the Y direction. In one embodiment, the top semiconductor layer of target design 300 may be structured into thin stripes (including FIN layer 308) using photolithography. Target design 300 also includes two diffusion contacts 302 and 304 separated by a gap 306. In one embodiment, the two diffusion contacts 302 and 304 may define the source and drain regions of a transistor in a memory bitcell array (e.g., read-only memory (ROM) array). In other embodiments, the two diffusion contacts 302 and 304 may be used to create other types of circuit elements.

In one embodiment, one goal for target design 300 may be to place diffusion contact 302 as close as possible to diffusion contact 304. However, as shown in FIG. 3, if diffusion contact 302 is placed too close to diffusion contact 304 during the layout phase of the design flow, such that separation gap 306 is smaller than the allowable separation in the Y direction, this may cause a spacing violation to be generated during the layout verification phase of the design flow.

For the purposes of comparison, an existing design 310 is shown at the bottom of FIG. 3. The existing design may use a larger separation gap 316 between the diffusion contacts 312 and 314. This larger gap 316 (as compared to gap 306) may allow for a design rule check (DRC) to result in a clean outcome during the layout verification phase of the design flow, but the layout will result in an area penalty by using a larger amount of area than target design 300. In various embodiments, such a layout may be created by a synthesis tool, manually, and/or a combination of the two.

Figure 4:
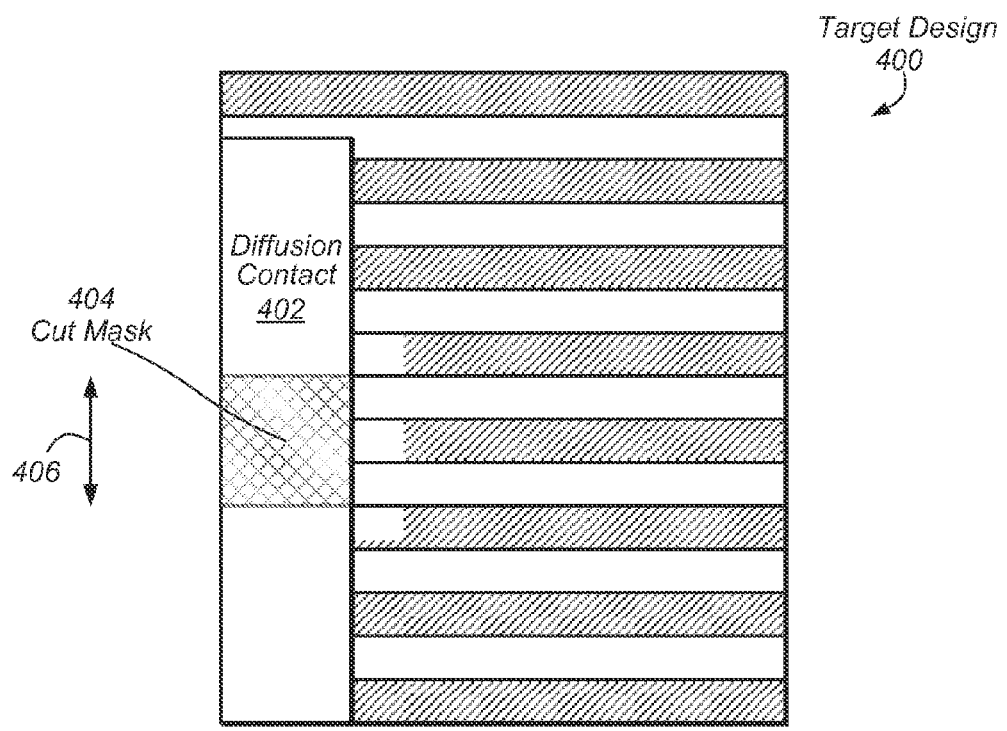
FIG. 4 is a diagram illustrating one embodiment of a target design.

Turning now to FIG. 4, a diagram of a target design 400 is shown. Target design 400 may utilize a different approach to achieving a desired gap width as compared to target design 300 of FIG. 3. First, the separate contacts may be merged into a single combined region (contact 402) responsive to detecting the spacing violation which was detected for target design 300. Then, a cut mask layer 404 may be formed over the merged contact 402 region. In one embodiment, an etch process (or other process) may then be used through the cut mask layer 404 to remove a portion of the diffusion contact 402, where the portion that is removed corresponds to a gap defined by the cut mask and has a width 406 which generally corresponds to the desired gap width. The desired gap width is less than or equal to the width of separation gap 306 which triggered the spacing violation. The separation gap may be utilized to separate a first portion of diffusion contact 402 from a second portion of diffusion contact 402. The first and second portions of diffusion contact 402 may correspond to diffusion contacts 302 and 304 of target design 300.

Figure 5:
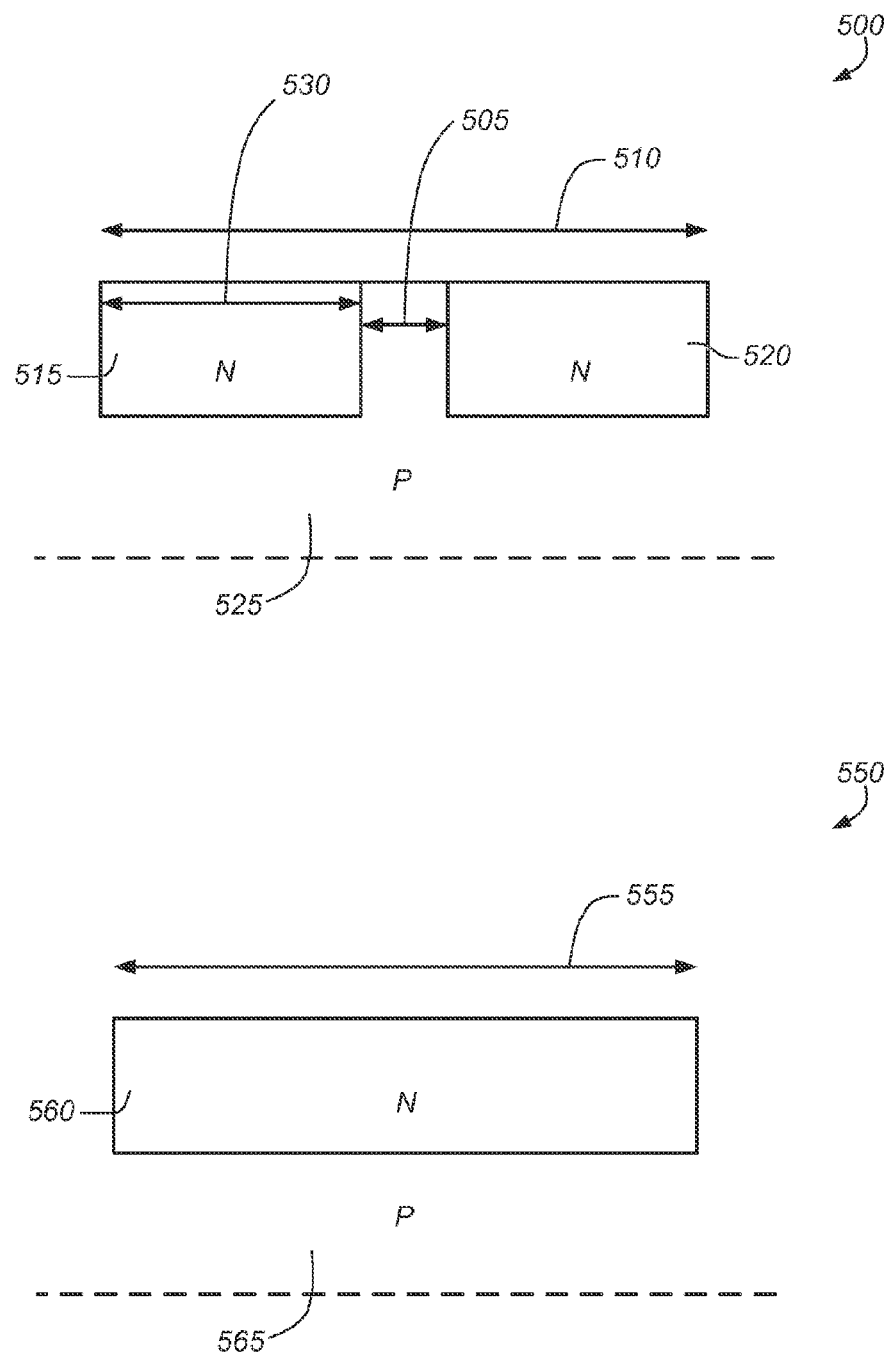
FIG. 5 illustrates cross-sectional views of two semiconductor structures in accordance with one embodiment.

Referring now to FIG. 5, cross-sectional views of one embodiment of semiconductor structure 500 and semiconductor structure 550 are shown. FIG. 5 is intended to represent semiconductor structures 500 and 550 at a given stage of manufacturing. Various stages of manufacturing may be utilized to fabricate semiconductor structures 500 and 550. Also, various types of fabrication flows may be utilized, depending on the embodiment.

At the top of FIG. 5, semiconductor structure 500 includes two separate regions 515 and 520 layered on top of substrate 525. The substrate 525 may have a first conductivity type, which in this example is shown as type P. The two doped regions 515 and 520 may have a second conductivity type, which in this example is shown as type N. Alternatively, in another embodiment, the two doped regions 515 and 520 may have different conductivity types. In one embodiment, one of the goals in designing semiconductor structure 500 may be to reduce the width of the channel 505 to a width smaller than that permitted by current design rules or smaller than is otherwise possible with a current fabrication process. In some embodiments, the goal may be to achieve a gap smaller that is otherwise possible based on the limitations of the lithography technologies being utilized to form features semiconductor structure 500. It is noted that only a portion of semiconductor structure 500 is shown in FIG. 5. It is noted that design rules and a design rules checker may generally correspond to the manufacturing process currently being used. As such, a minimum spacing that is checked for by a design rule checker may correspond to a minimum spacing that can be achieved by the current process. However, it is noted that the methods and mechanisms described herein may be used whether or not the design rules currently in place accurately reflect the capabilities of the current process. It is also noted that the methods and mechanisms described herein may be used for any layers of a device.

Based on the manufacturing methods being used and/or design rules in place to design semiconductor structure 500, there may be a minimum size that can be utilized for channel 505. If an attempt is made to place regions 515 and 520 too close together, such that the width of channel 505 is below what is lithographically achievable with the particular lithography being utilized, then a design rule check (DRC) error may be generated by the design tool used to verify the semiconductor structure design prior to fabrication. It may be assumed for the purposes of this discussion that the width 505 shown in semiconductor structure 500 is the minimum allowable distance which may be used to separate regions 515 and 520 without violating current design rules. Other dimensions are also shown for semiconductor structure 500, including region width 530, which may or may not be the same for both regions 515 and 520. Also, the total width 510 of the transistor is shown, and total width 510 encompasses regions 515 and 520 and channel 505.

At the bottom of FIG. 5, an alternate approach for designing a semiconductor structure 550 is shown. This alternate approach may enable separate regions to be placed closer together than is possible for semiconductor structure 500 according to current design rules. Semiconductor structure 550 may eventually have two distinct regions separated by a narrow channel, but the two diffused regions may be initially formed as a single region 560 (e.g., N-type region in this example) which is adjacent to a P-type substrate 565. The width 555 of region 560 is shown adjacent to region 560, and may or may not be less than the total width 510 of regions 515 and 520 and channel 505 of semiconductor structure 500. It is noted that the use of N-type and P-type regions for semiconductor structures 500 and 550 may be reversed in other embodiments. It is noted that while the present discussion describes a layer as adjacent to another, it is to be appreciated that embodiments are contemplated in which the layers are not strictly adjacent to one another. Rather, one or more layers may be interposed between the layers being discussed. Similarly, when describing a layer as above or on top of another layer, this is for ease of discussion and illustration. On top of or above are simply relative terms depending on the perspective. Given a different perspective, the layers may be viewed as under or below. All such alternatives are possible and are contemplated.

Figure 6:
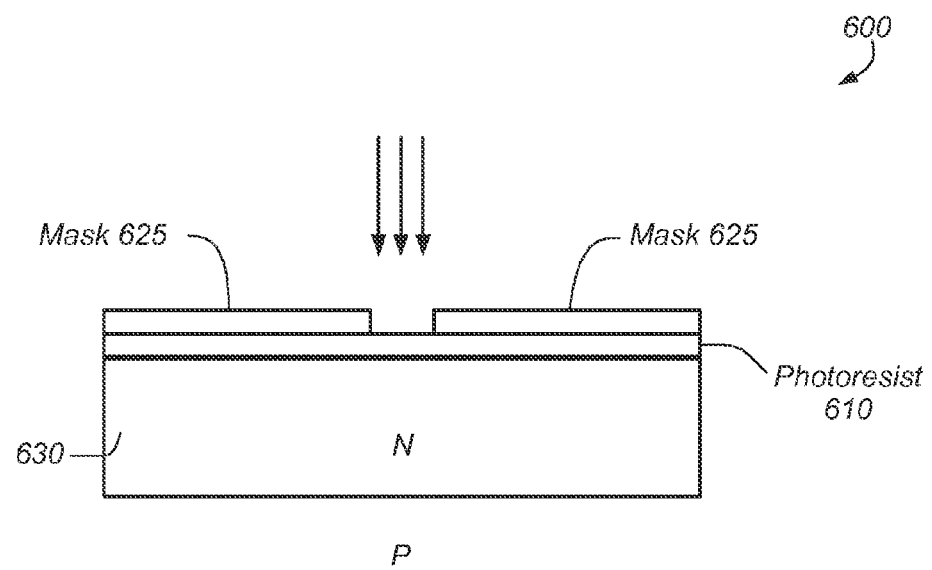
FIG. 6 is a diagram illustrating a cross-sectional view of a semiconductor structure.

Turning now to FIG. 6, a cross-sectional view of a semiconductor structure 600 is shown. Semiconductor structure 600 is intended to represent semiconductor structure 550 (of FIG. 5) at a later stage of the manufacturing process. A patterning technique may be utilized to form the mask 625 and then the pattern may be transferred to photoresist layer 610 by exposing a layer of resist 610 formed on region 630 to light. In some embodiments, the light may be reflected from portions of a reflective surface. Next, an etch process may be performed. In one embodiment, the etch process may remove portions of the photoresist layer 610 not covered by the mask 625. In other embodiments, other types of lithography and etching techniques may be utilized to transfer patterns to region 630 so as to split region 630 into two separate regions.

Figure 7:
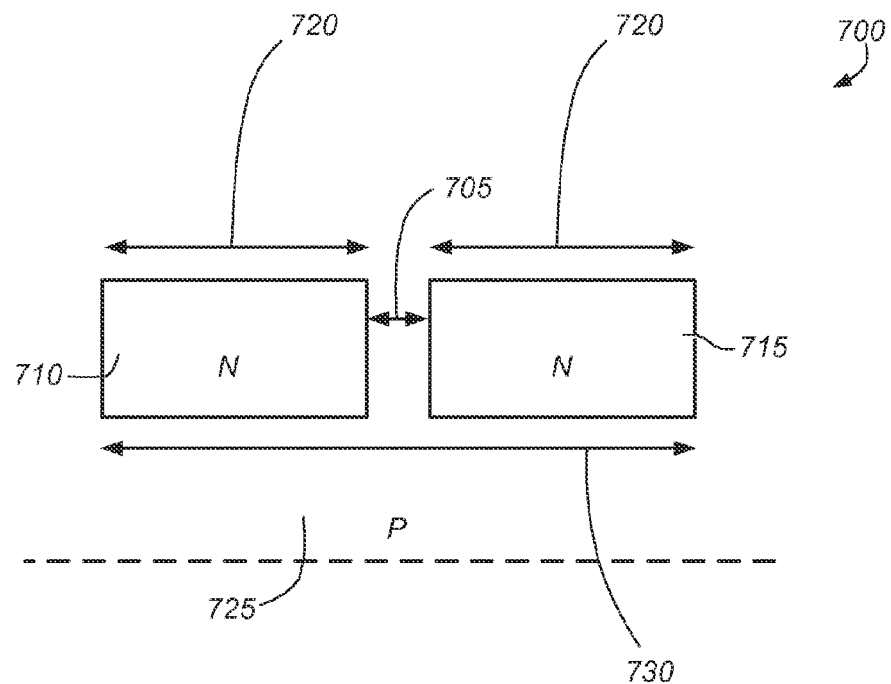
FIG. 7 is another diagram illustrating a cross-sectional view of a semiconductor structure.

Turning now to FIG. 7, a cross-sectional view of a semiconductor structure 700 is shown. Semiconductor structure 700 is intended to represent semiconductor structure 600 (of FIG. 6) at a later stage of the manufacturing process after the channel 705 has been removed (etched away) from the combined region to create separate regions 710 and 715 on top of substrate 725. It may be assumed for the purposes of this discussion that the width of channel 705 is less than the width 505 which was allowable for creating the channel of semiconductor structure 500 (of FIG. 5) using a traditional semiconductor manufacturing approach. In some embodiments, the width 720 of each of regions 710 and 715 is the same as width 530 of region 515 (of FIG. 5). Accordingly, the total width 730 of the transistor in semiconductor structure 700 may be less than the total width 510 of the transistor in semiconductor structure 500. This allows for an area reduction in the size of the transistor, and when the transistor is utilized in memory bitcells or in other circuits, this achieves a reduction in the size of these overall circuits.

Figure 8:
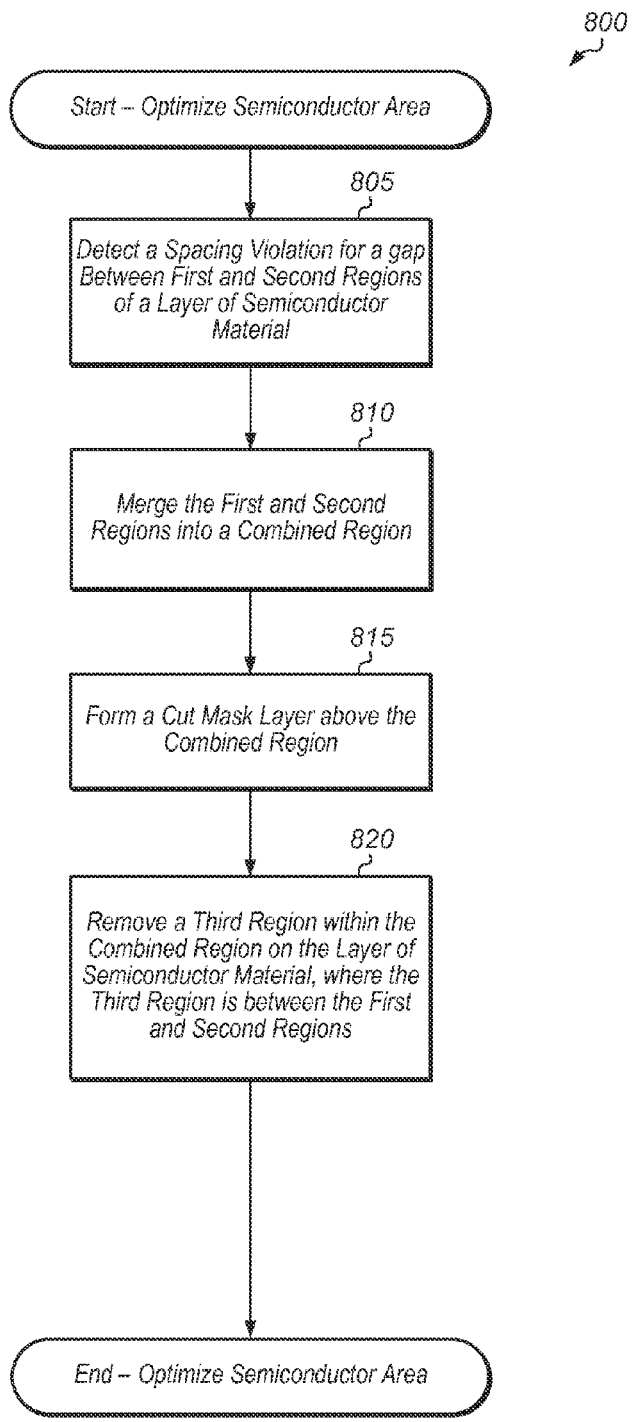
FIG. 8 is a generalized flow diagram illustrating one embodiment of a method for achieving reduced gap width in a semiconductor device.

Turning now to FIG. 8, one embodiment of a method 800 for optimizing semiconductor area is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various devices, apparatuses, or systems described herein may be configured to implement method 800. For example, an apparatus may be configured to perform one or more of the steps depicted in FIG. 8 (or any of the other steps described herein). For example, the apparatus may have circuitry and or components configured to detect spacing violations, to merge regions that correspond to spacing violations, to form cut mask layers, to remove regions identified by cut mask layers, and otherwise. As such, each of the steps depicted in FIG. 8 may correspond to components or circuitry of an apparatus designed and/or programmable to perform the illustrated steps. Such an apparatus may be a dedicated semiconductor fabrication device with circuitry configured to perform the steps. Alternatively, the apparatus may comprise circuitry programmable to perform the steps. Still further, the apparatus may comprise a combination of dedicated circuitry and programmable circuitry. Numerous such embodiments are possible and are contemplated.

A spacing violation may be detected for a first separation width between first and second regions of a layer of semiconductor material (block 805). In some embodiments, the layer of semiconductor material may be located on top of one or more other layers of a semiconductor structure. In one embodiment, the spacing violation may be detected during layout verification by a design rule check (DRC) tool. Next, the first and second regions may be merged into a combined region on the first layer of semiconductor material in response to detecting the spacing violation (block 810).

Next, a cut mask layer may be formed above the combined region on the first layer of semiconductor material (block 815). Then, an etch process may be performed through the cut mask layer to remove an exposed third region within the combined region on the first layer of semiconductor material, wherein the exposed third region is interposed between first and second region portions of the combined region, wherein the exposed third region has a second width, and wherein the second width is less than or equal to the first separation width (block 820). The first and second region portions of the combined region correspond to the original first and second regions which were merged in block 810 to form the combined region. It should be understood that additional steps may be performed before, during, and after method 800. For example, one or more additional steps may be performed subsequent to block 820 to finalize the fabrication of the semiconductor device in accordance with standard semiconductor processing techniques. After block 820, method 800 may end.

In various embodiments, program instructions of a software application may be used to implement the methods and/or mechanisms previously described. For example, the program instructions may describe operations of a semiconductor manufacturing tool and/or process. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computing system during use to provide the program instructions and accompanying data to the computing system for program execution. The computing system may include at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A method of fabricating a semiconductor device, the method comprising:
   performing a design rule check on a layout of a semiconductor device;
   detecting a width of a gap between a first region and a second region of a layer of semiconductor material of the semiconductor device represents a spacing violation;
   in response to detecting the spacing violation:
      merging the first region and the second region into a combined region of the layer of semiconductor material;
      forming a cut mask layer above the combined region of the layer of semiconductor material; and
      removing a third region within the combined region of the layer of semiconductor material, wherein the third region is defined by the cut mask layer and is interposed between the first region and the second region, and wherein removal of the third region restores the gap representing the spacing violation between the first region and the second region.

2. The method as recited in claim 1, wherein the third region has a width that is less than or equal to a width of the gap.

3. The method as recited in claim 1, wherein removing the third region results in the combined region being separated into a first region portion and a second region portion.

4. The method as recited in claim 3, wherein the first region portion corresponds to a source region of a transistor, and wherein the second region portion corresponds to a drain region of the transistor.

5. The method as recited in claim 3, wherein the third region corresponds to a channel region of a transistor.

6. The method as recited in claim 1, wherein the semiconductor device corresponds to a bitcell of a memory array.

7. A non-transitory computer readable medium comprising program instructions, wherein the program instructions are executable to:
   perform a design rule check on a layout of a semiconductor device;
   detect a width of a gap between a first region and a second region of a layer of semiconductor material of the semiconductor device represents a spacing violation;
   in response to detecting the spacing violation:
      merge the first region and second region into a combined region of the layer of semiconductor material responsive to detecting the spacing violation;
      form a cut mask layer above the combined region of the layer of semiconductor material; and
      remove a third region within the combined region of the layer of semiconductor material, wherein the third region is defined by the cut mask layer and is interposed between the first region and the second region, and wherein removal of the third region restores the gap representing the spacing violation between the first region and the second region.

8. The non-transitory computer readable medium as recited in claim 7, wherein the third region has a width that is less than or equal to a width of the gap.

9. The non-transitory computer readable medium as recited in claim 7, wherein removing the third region results in the combined region being separated into a first region portion and a second region portion.

10. The non-transitory computer readable medium as recited in claim 9, wherein the first region portion corresponds to a source region of a transistor, and wherein the second region portion corresponds to a drain region of the transistor.

11. The non-transitory computer readable medium as recited in claim 7, wherein the third region corresponds to a channel region of a transistor.

12. An apparatus comprising:
   circuitry configured to perform a design rule check on a layout of a semiconductor device and detect a width of a gap between a first region and a second region of a layer of semiconductor material of the semiconductor device represents a spacing violation;
   in response to detecting the spacing violation, circuitry configured
      merge the first region and second region into a combined region of the layer of semiconductor material;
      form a cut mask layer above the combined region of the layer of semiconductor material; and
      remove a third region within the combined region of the layer of semiconductor material, wherein the third region is defined by the cut mask layer and is interposed between the first region and the second region, and wherein removal of the third region restores the gap representing the spacing violation between the first region and the second region.

13. The apparatus as recited in claim 12, wherein the third region has a width that is less than or equal to a width of the gap.

14. The apparatus as recited in claim 12, wherein removing the third region results in the combined region being separated into a first region portion and a second region portion.

15. The apparatus as recited in claim 14, wherein the first region portion corresponds to a source region of a transistor, and wherein the second region portion corresponds to a drain region of the transistor.

16. The apparatus as recited in claim 15, wherein the third region corresponds to a channel region of the first transistor.

17. The apparatus as recited in claim 12, wherein the semiconductor material corresponds a memory device.

* * * * *

UNITED STATES PATENT AND TRADEMARK OFFICE
CERTIFICATE OF CORRECTION

PATENT NO. : 9,710,589 B2
APPLICATION NO. : 14/748795
DATED : July 18, 2017
INVENTOR(S) : Dave et al.

It is certified that error appears in the above-identified patent and that said Letters Patent is hereby corrected as shown below:

In the Claims

Column 8, Claim 12, Line 26, please delete "configured" and substitute -- configured to --.

Signed and Sealed this
Thirty-first Day of October, 2017

Joseph Matal
*Performing the Functions and Duties of the
Under Secretary of Commerce for Intellectual Property and
Director of the United States Patent and Trademark Office*